United States Patent
Wan et al.

(10) Patent No.: US 10,333,277 B2
(45) Date of Patent: Jun. 25, 2019

(54) STRUCTURE LIGHT MODULE USING VERTICAL CAVITY SURFACE EMITTING LASER ARRAY

(71) Applicant: OmniVision Technologies, Inc., Santa Clara, CA (US)

(72) Inventors: Tsung-Wei Wan, Hsinchu County (TW); Wei-Ping Chen, New Taipei (TW)

(73) Assignee: OmniVision Technologies, Inc., Santa Clara, CA (US)

(*) Notice: Subject to any disclaimer, the term of this patent is extended or adjusted under 35 U.S.C. 154(b) by 0 days.

(21) Appl. No.: 15/795,130

(22) Filed: Oct. 26, 2017

(65) Prior Publication Data

US 2019/0131771 A1 May 2, 2019

(51) Int. Cl.
*H01S 5/183* (2006.01)
*H01L 21/02* (2006.01)
*H01S 3/08* (2006.01)

(52) U.S. Cl.
CPC .... *H01S 5/18388* (2013.01); *H01L 21/02008* (2013.01); *H01S 3/08009* (2013.01)

(58) Field of Classification Search
CPC ............ H01S 5/18388; H01S 3/08009; H01L 21/02008
See application file for complete search history.

(56) References Cited

U.S. PATENT DOCUMENTS

| | | | | |
|---|---|---|---|---|
| 5,850,412 A | * | 12/1998 | Eguchi | H01S 3/005 372/109 |
| 2004/0179562 A1 | * | 9/2004 | Carroll | H01S 5/02212 372/36 |
| 2005/0105578 A1 | * | 5/2005 | Mitsuya | G11B 7/1275 372/50.1 |
| 2012/0218648 A1 | * | 8/2012 | Lin | G02B 13/0085 359/715 |
| 2016/0197452 A1 | * | 7/2016 | Mor | G01B 11/2513 359/569 |
| 2016/0254638 A1 | | 9/2016 | Chen et al. | |

* cited by examiner

*Primary Examiner* — Xinning (Tom) Niu

(57) ABSTRACT

A structure light module comprises: a VCSEL substrate comprising a VCSEL array comprising a plurality of individual VCSELs; a first spacer disposed on the VCSEL substrate; a wafer level lens comprising a glass substrate and at least a replicated lens on a first surface of the glass substrate disposed on the first spacer; a second spacer disposes on the wafer level lens; a DOE disposed on the second spacer, where a structure light is projected from the DOE on a target surface for 3D imaging.

20 Claims, 4 Drawing Sheets

STRUCTURE LIGHT MODULE USING VERTICAL CAVITY SURFACE EMITTING LASER ARRAY

FIELD OF THE INVENTION

This invention relates to a structure light module, and more specifically relates to a structure light module using vertical cavity surface emitting laser array.

BACKGROUND OF THE INVENTION

There are many solutions for capturing 3D images including stereo camera, time-of-flight, and structure light. In the solution using structure light, a periodical pattern is generated as structure light. The periodical pattern may comprise periodical lines such as 1D or 2D grid. It may also comprise 1D or 2D periodical pattern of dots. The structure light is projected on a target surface, and the structure light on the target surface is captured by a camera. If the target surface is flat, the captured structure light is not distorted. If the target surface is not flat, the topographical structure of the target surface will distort the projected structure light. The topographical structure of the target surface can be retrieved from the captured distorted structure light. In this manner, structure light may be used for 3D imaging.

The structure light may be IR light or visible light. An IR camera may be used for capturing the IR structure light on the target surface, and a visible camera may be used for capturing the visible structure light on the target surface.

The stereo camera solution needs a sufficient parallax, which in turn needs a relatively large base line between two cameras. The time-of-flight solution needs an advanced electronic processor to determine the time difference between the light firing time and the reflected light receiving time. The structure light solution is getting popular recently since it does not need large base line between two cameras, and it does not need advanced electronic processor.

However, the size of a conventional structure light module is still relatively large for consumer electronic applications. Accordingly, a novel structure light module having small size is demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
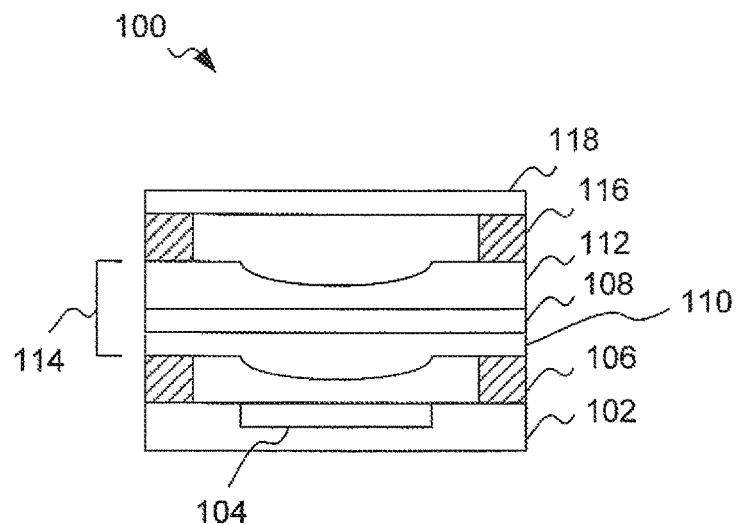
FIG. 1 schematically illustrates a structure light module, according to an embodiment of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

In some implementations, conventional structure light modules may use VCSEL (vertical cavity surface emitting laser) arrays. The size of the conventional structure light module using VCSEL array may not be further reduced effectively because: (1) the module uses barrel and lens holder, (2) the single lens is thick, and (3) the lens cannot be disposed close to the VCSEL array, because the VCSEL array is hot after turning on. In the conventional structure light module, the lens module may have de-center caused by the lens barrel and holder assembly.

Some embodiments of the present invention may use wafer level lenses and wafer level spacers stacked on a VCSEL array. Accordingly, barrels and lens holders are not used. The wafer level lenses are thin and can be disposed close to the VCSEL array, because the lenses have been reflowed under relatively high temperature. It is appreciated that the embodiments are for illustrative purpose and do not limit the scope of the present invention.

FIG. 1 schematically illustrates a structure light module 100, according to an embodiment of the present invention. A VCSEL substrate 102 comprises a VCSEL array 104. VCSEL array 104 comprises a plurality of individual VCSELs. VCSEL array 104 may emit IR light or visible light. A first spacer 106 may be disposed directly or indirectly on VCSEL substrate 102. A glass substrate 108 may have a first replicated lens 110 replicated on a first surface of glass substrate 108 and a second replicated lens 112 replicated on a second surface of glass substrate 108. Glass substrate 108 together with first replicated lens 110 and second replicated lens 112 form a wafer level lens 114. It is appreciated that wafer level lens 114 may comprise glass substrate 108 and only first replicated lens 110 or only second replicated lens 112. A second spacer 116 may be disposed directly or indirectly on wafer level lens 114. A DOE (diffractive optical element) 118 may be disposed directly or indirectly on second spacer 116.

Wafer level lens 114 may be reflowed or baked to harden first replicated lens 110 and/or second replicated lens 112. After reflow, wafer level lens 114 may not deform because of high temperature. In an embodiment, first replicated lens 110 and/or second replicated lens 112 may be UV cured.

DOE 118 generates a far field diffraction pattern when it is illuminated by a coherent light. The coherent light may be collimated or not collimated. DOE 118 may be a grating, a phase grating, a Dammann grating, a group of grooves on a glass substrate, and the like.

When VCSEL array 104 is turned on, each individual VCSEL emits a coherent light. The emitted coherent light passes through wafer level lens 114 and directed to illuminate DOE 118. The coherent light may be collimated or not collimated by wafer level lens 114. DOE 118 generates a far field diffraction pattern when it is illuminated with the coherent light. The generated far field diffraction pattern may be a periodical pattern that may comprise periodical lines or periodical dots. The generated far field diffraction is the structure light for 3D imaging. Accordingly, a structure light is projected from DOE 118 on a target surface for 3D imaging.

Alternatively, an imaging lens (not shown) may be used. The imaging lens images the intensity pattern generated by the DOE 118 on a target surface. In other words, the DOE 118 plane is the object plane and the target surface is the image plane of the imaging lens. In this situation, the far field diffraction pattern is not used for generating the structure light.

Figure 2:
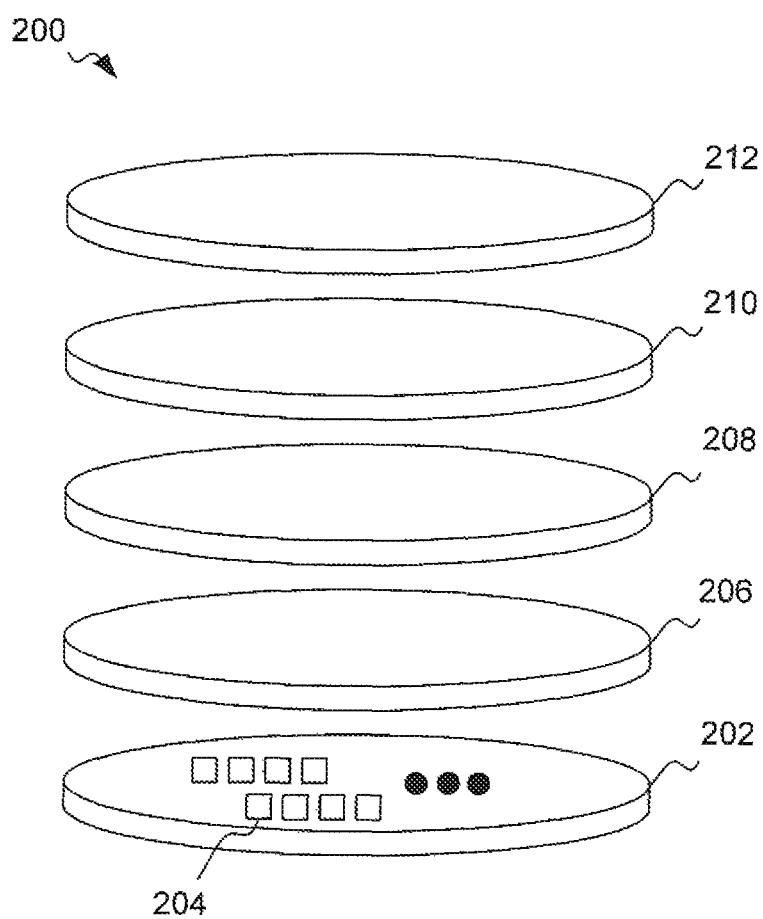
FIG. 2 schematically illustrates a method for fabricating structure light modules, according to an embodiment of the present invention.

FIG. 2 schematically illustrates a method 200 for fabricating structure light modules, according to an embodiment of the present invention. A VCSEL wafer 202 comprises a plurality of VCSEL arrays 204. A first spacer wafer 206 having a plurality of through holes (not shown) is disposed on VCSEL wafer 202. At least one through hole of the plurality of through holes is aligned with a VCSEL array of the plurality of VCSEL arrays 204. A lens wafer 208 comprising a plurality of replicated lenses (not shown) on at least a first surface of lens wafer 204 is disposed on first spacer wafer 206. At least one replicated lens of the plurality of replicated lens is aligned with a VCSEL array of the plurality of VCSEL arrays 204. A second spacer wafer 210 having a plurality of through holes (not shown) is disposed on lens wafer 208. At least one through hole of the plurality of through holes is aligned with a VCSEL array of the plurality of VCSEL arrays 204. A DOE wafer 212 comprising a plurality of DOEs (not shown) is disposed on second spacer wafer 210. At least one DOE of the plurality of DOEs is aligned with a VCSEL array of the plurality of VCSEL arrays 204. DOE wafer 212 may comprise grooves on its substrate.

After all wafers are properly stacked and bonded, the stacked and bonded wafers are singulated to produce each structure light module 100 as shown in FIG. 1. The stacked wafers comprise VCSEL wafer 202, first spacer wafer 206, lens wafer 208, second spacer wafer 210, and DOE wafer 212. It is appreciated that VCSEL wafer 202 may be a silicon or semiconductor wafer while other wafers may not be silicon or semiconductor wafers.

Figure 3:
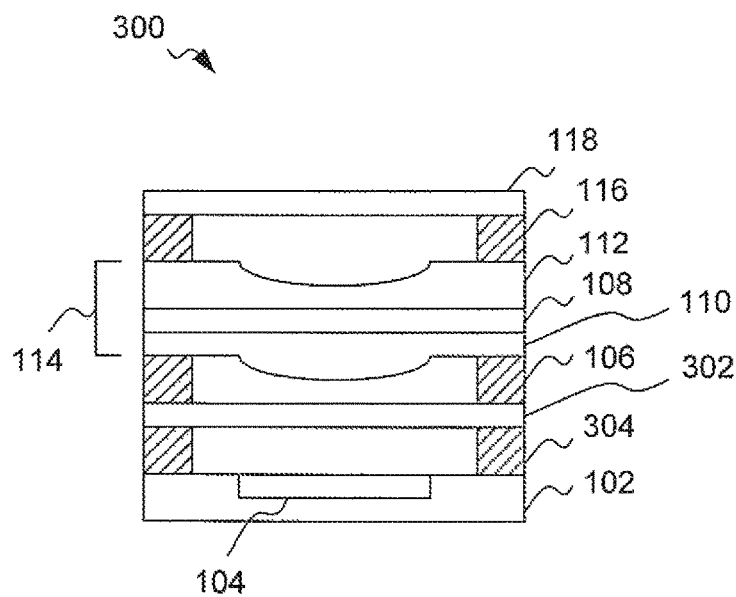
FIG. 3 schematically illustrates a structure light module further comprising a heat insulation glass, according to an embodiment of the present invention.

FIG. 3 schematically illustrates a structure light module 300, according to an embodiment of the present invention. Structure light module 300 is similar to structure light module 100 of FIG. 1, except structure light module 300 further comprises a heat insulation glass 302 and a third spacer 304. Third spacer 304 is disposed directly or indirectly on VCSEL substrate 102, and heat insulation glass 302 is disposed directly or indirectly on third spacer 304. First spacer 106 is disposed directly or indirectly on heat insulation glass 302, and so forth. Heat insulation glass 302 may block the heat emitted from VCSEL array 104 to arrive at wafer level lens wafer 114. Accordingly, over heating deformation of wafer level lens 114 may be prevented. It is appreciated that heat insulation glass 302 is optional. Similar to structure light module 100, a structure light is projected from DOE 118 on a target surface for 3D imaging.

Accordingly, method 200 for fabricating structure light modules further comprises a third spacer wafer (not shown) having a plurality of through holes is disposed on VCSEL wafer 202. At least one through hole of the plurality of through holes is aligned with a VCSEL array of the plurality of VCSEL arrays 204. A heat insulation wafer (not shown), which may be a heat insulation glass, is disposed on the third spacer. First spacer wafer 206 is disposed on the heat insulation wafer, and so forth.

A wafer stack comprising VCSEL wafer 202, the third spacer wafer, the heat insulation wafer, first spacer wafer 206, lens wafer 208, second spacer wafer 210, and DOE wafer 212 is formed. The formed wafer stack is singulated to produce each structure light module.

In an embodiment, third spacer 304 may be recognized as a first spacer, first spacer 106 may be recognized as a second spacer, and second spacer 116 may be recognized as a third spacer.

Figure 4:
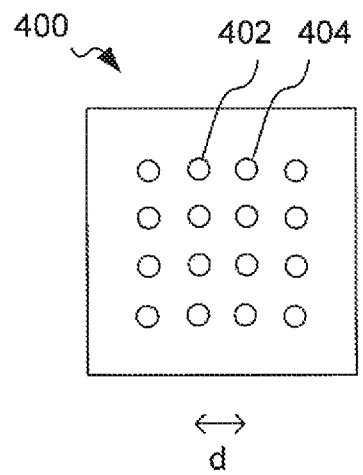
FIG. 4 schematically illustrates a VCSEL (vertical cavity surface emitting laser) array, according to an embodiment of the present invention.

FIG. 4 schematically illustrates a VCSEL array 400, according to an embodiment of the present invention. VCSEL array 400 may be VCSEL array 104 in FIGS. 1 and 3. VCSEL array 400 comprises a plurality of individual VCSELs, including a first individual VCSEL 402 and a second individual VCSEL 404. For example, individual VCSELs are evenly arranged on a surface. For example, a distance between first individual VCSEL 402 and second individual VCSEL 404 is d.

Figure 5:
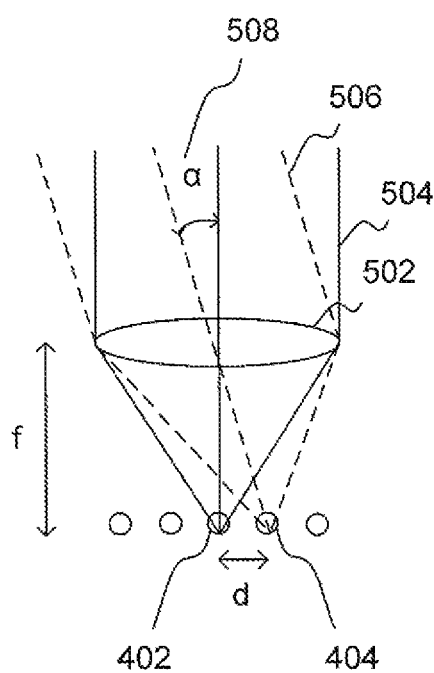
FIG. 5 schematically illustrates a lens collimating light emitted by two individual VCSELs, according to an embodiment of the present invention.

FIG. 5 schematically illustrates a lens 502 that collimates light emitted by first individual VCSEL 402 and second individual VCSEL 404, according to an embodiment of the present invention. Lens 502 may be wafer level lens 114 of FIGS. 1 and 3. First individual VCSEL 402 and second individual VCSEL 404 may be individual VCSELs included in VCSEL array 104 of FIGS. 1 and 3. Light emitted from first individual VCSEL 402 is collimated by lens 502 becoming a first collimated beam 504 (solid line). Light emitted from second individual VCSEL 402 is collimated by lens 502 becoming a second collimated beam 506 (dashed line). Lens 502 has a focal length f. First individual VCSEL 402 and second individual VCSEL 404 are disposed on a surface at focal length f away from lens 502. The distance between first individual VCSEL 402 and second individual VCSEL 404 is d. An angle between first collimated beam 504 and second collimated beam 506 is α 508. Individual VCSELs are arranged periodically, thus the angle between successive collimated beams formed by lens 502 is α.

Figure 6:
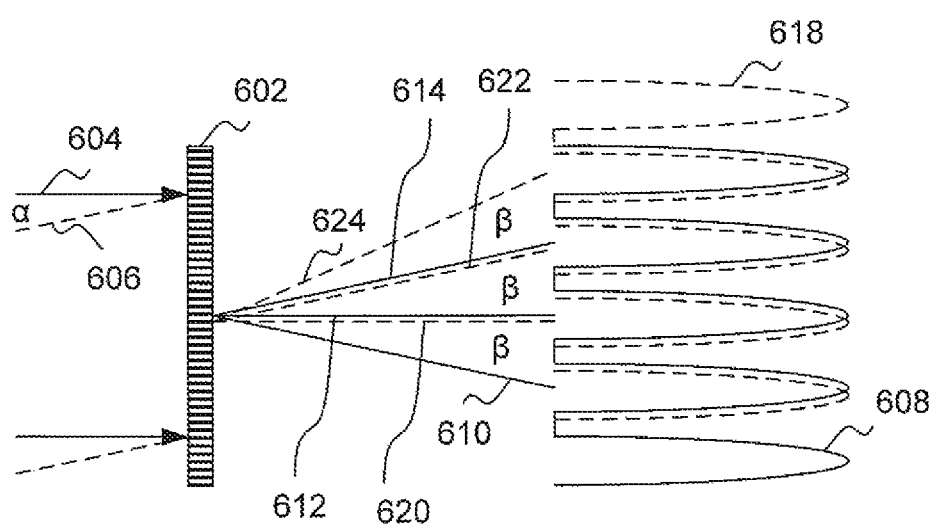
FIG. 6 schematically illustrates a DOE (diffractive optical element) illuminated by two collimated beams generating a far field diffraction pattern, according to an embodiment of the present invention.

FIG. 6 schematically illustrates a DOE 602 illuminated by a first collimated beam 604 (solid line) and a second collimated beam 606 (dashed line), according to an embodiment of the present invention. First collimated beam 604 may be first collimated beam 504 of FIG. 5. Second collimated beam 606 may be second collimated beam 506 of FIG. 5. A first far field diffraction pattern 608 (solid line) is generated by DOE 602 under illumination of first collimated beam 604. Far field diffraction pattern 608 may be a periodical pattern having multiple maxima. For example, the multiple maxima comprises a first maximum at a first angular position 610 (solid line), a second maximum at a second angular position 612 (solid line), a third maximum at a third angular position 614 (solid line), and so forth. First maximum 610 and second maximum 612 form an angle β, second maximum 612 and third maximum 614 form an angle β, and so forth. Successive maxima of the multiple maxima form an angle β.

A second far field diffraction pattern 618 (dashed line) is generated by DOE 602 under illumination of second collimated beam 606. Second far field diffraction pattern 618 is identical to first far field diffraction pattern 608, which is a periodical pattern having multiple maxima. Second far field diffraction pattern 618 is shifted away from first far field diffraction pattern 608. For example, the multiple maxima comprises a first maximum at a first angular position 620 (dashed line), a second maximum at a second angular position 622 (dashed line), a third maximum at a third angular position 624 (dashed line), and so forth. First maximum 620 and second maximum 622 form an angle β, second maximum 622 and third maximum 624 form an angle β, and so forth. Successive maxima of the multiple maxima form an angle β.

If first collimated beam 604 and second collimated beam 606 form an angle α similar to FIG. 5, and for α equals β, first maximum 620 of second far field diffraction pattern 618 coincides with second maximum 612 of first far field diffraction pattern 608. Second maximum 622 of second far field diffraction pattern 618 coincides with third maximum 614 of first far field diffraction pattern 608, and so forth. In this manner, the superimposed far field diffraction patterns will be identical to a single far field diffraction patterns, for example, first far field diffraction pattern 608 alone. Because, each far field diffraction pattern coincides with another far field diffraction pattern.

In other words, the angle formed by two successive collimated beams α equals the angle β formed by two successive maxima of the multiple maxima of the far field diffraction pattern. In this manner, a single far field diffraction pattern may be generated. The generated single far field diffraction pattern is a periodical pattern that may comprise periodical lines or periodical dots. The generated far field diffraction pattern is the structure light for 3D imaging. The structure light may be projected on a target surface.

The relation between VCSEL array 104, wafer level lens 114, and DOE 118 may be given as follows. Two successive maxima generated by DOE 118 form an angle β, and tan β=d/f, where d is the distance of two successive individual VCSELs included in VCSEL array 104 and f is the focal length of wafer level lens 114. Angle β is determined by the structure of DOE 118.

It is appreciated that the mentioned condition tan β=d/f can be ignored if an imaging lens is used to image the intensity pattern at DOE 118 on the target surface. In this embodiment, a structure light may be projected by a lens from the DOE on a target surface for 3D imaging.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A structure light module comprising:
   a VCSEL (vertical cavity surface emitting laser) substrate comprising a VCSEL array comprising a plurality of individual VCSELs;
   a first spacer disposed on the VCSEL substrate;
   a wafer level lens comprising a glass substrate and at least a replicated lens on a first surface of the glass substrate disposed on the first spacer, wherein the lens collimates light emitted by the plurality of individual VCSELs;
   a second spacer disposes on the wafer level lens;
   a DOE (diffractive optical element) disposed on the second spacer.

2. The structure light module of claim 1, wherein a structure light is projected from the DOE on a target surface for 3D imaging.

3. The structure light module of claim 1, wherein the DOE generates a far field diffraction pattern comprising one of periodical lines and periodical dots.

4. The structure light module of claim 3, wherein the generated far field diffraction pattern is a periodical pattern having multiple maxima, successive maxima of the multiple maxima form an angle, the tangent value of the formed angle is d/f, wherein d is a distance between successive individual VCSELs of the VCSEL array, and f is a focal length of the wafer level lens.

5. The structure light module of claim 1, wherein the DOE is one of a grating, a phase grating, a Dammann grating, and a group of grooves on a glass substrate.

6. The structure light module of claim 1, wherein the wafer level lens comprising a glass substrate and a first replicated lens on a first surface of the glass substrate and a second replicated lens on a second surface of the glass substrate.

7. The structure light module of claim 1, wherein the VCSEL array emits one of IR light and visible light.

8. The structure light module of claim 1, further comprising an imaging lens for imaging an intensity pattern generated by the DOE on a target surface for 3D imaging.

9. A method for fabricating a structure light module comprising:
   providing a VCSEL (vertical cavity surface emitting laser) wafer comprising a plurality of VCSEL arrays;
   providing a first spacer wafer having a plurality of through holes, wherein at least one through hole of the plurality of through holes is aligned with a VCSEL array of the plurality of VCSEL arrays;
   providing a lens wafer comprising a plurality of replicated lenses on at least a first surface of the lens wafer, wherein at least one replicated lens of the plurality of the replicated lens is aligned with a VCSEL array of the plurality of VCSEL arrays;
   providing a second spacer wafer having a plurality of through holes, wherein at least one through hole of the plurality of through holes is aligned with a VCSEL array of the plurality of VCSEL arrays;
   providing a DOE (diffractive optical element) wafer comprising a plurality of DOEs, wherein at least one DOE of the plurality of DOEs is aligned with a VCSEL array of the plurality of VCSEL arrays.

10. The method for fabricating a structure light module of claim 9 further comprising:
    disposing the first spacer wafer on the VCSEL wafer;
    disposing the lens wafer on the first spacer wafer;

disposing the second spacer wafer on the lens wafer;
disposing the DOE wafer on the second spacer wafer;
wherein a wafer stack comprising the VCSEL wafer, the first spacer wafer, the lens wafer, the second spacer wafer, and the DOE wafer is formed.

11. The method for fabricating a structure light module of claim 10 further comprising:
singulating the formed wafer stack to produce each structure light module.

12. The method for fabricating a structure light module of claim 9 further comprising:
providing a heat insulation wafer; and
providing a third spacer wafer having a plurality of through holes, wherein at least one through hole of the plurality of through holes is aligned with a VCSEL array of the plurality of VCSEL arrays.

13. The method for fabricating a structure light module of claim 12 further comprising:
disposing the third spacer wafer on the VCSEL wafer;
disposing the heat insulation wafer on the third spacer wafer;
disposing the first spacer wafer on the heat insulation wafer;
disposing the lens wafer on the first spacer wafer;
disposing the second spacer wafer on the lens wafer;
disposing the DOE wafer on the second spacer wafer;
wherein a wafer stack comprising the VCSEL wafer, the third spacer wafer, the heat insulation wafer, the first spacer wafer, the lens wafer, the second spacer wafer, and the DOE wafer is formed.

14. The method for fabricating a structure light module of claim 13 further comprising:
singulating the formed wafer stack to produce each structure light module.

15. The method for fabricating a structure light module of claim 12, wherein the heat insulation wafer is a heat insulation glass.

16. The method for fabricating a structure light module of claim 9,
wherein a DOE of the plurality of DOEs generates a far field diffraction patter;
wherein a VCSEL array of the plurality of VCSEL arrays comprises a plurality of individual VCSELs;
wherein the far field diffraction pattern generated by the DOE is a periodical pattern having multiple maxima, successive maxima of the multiple maxima form an angle, the tangent value of the formed angle is d/f;
wherein d is a distance between successive individual VCSELs of the plurality of individual VCSELs; and
wherein f is a focal length of a replicated lens of the plurality of replicated lenses of the lens wafer.

17. A structure light module comprising:
a VCSEL (vertical cavity surface emitting laser) substrate comprising a VCSEL array comprising a plurality of individual VCSELs;
a first spacer disposed on the VCSEL substrate;
a heat insulation glass disposed on the first spacer;
a second spacer disposed on the heat insulation glass;
a wafer level lens comprising a glass substrate and at least a replicated lens on a surface of the glass substrate disposed on the second spacer, wherein the lens collimates light emitted by the plurality of individual VCSELs;
a third spacer disposes on the wafer level lens;
a DOE (diffractive optical element) disposed on the third spacer.

18. The structure light module of claim 17, wherein a structure light is projected from the DOE on a target surface for 3D imaging.

19. The structure light module of claim 17, wherein the DOE generates a far field diffraction pattern comprising a periodical pattern having multiple maxima, successive maxima of the multiple maxima form an angle, the tangent value of the formed angle is d/f, wherein d is a distance between successive individual VCSELs of the VCSEL array, and f is a focal length of the wafer level lens.

20. The structure light module of claim 17, further comprising an imaging lens for imaging an intensity pattern generated by the DOE on a target surface for 3D imaging.

* * * * *